United States Patent [19]

Butler et al.

[11] Patent Number: 5,458,732

[45] Date of Patent: Oct. 17, 1995

[54] METHOD AND SYSTEM FOR IDENTIFYING PROCESS CONDITIONS

[75] Inventors: Stephanie W. Butler, Plano; Keith J. Brankner, Richardson, both of Tex.

[73] Assignee: Texas Instruments Incorporated, Dallas, Tex.

[21] Appl. No.: 188,653

[22] Filed: Jan. 28, 1994

Related U.S. Application Data

[63] Continuation of Ser. No. 868,357, Apr. 14, 1992, abandoned.

[51] Int. Cl.$^6$ .................................................. G01R 29/00
[52] U.S. Cl. ........................... 216/61; 156/345; 427/8; 118/692; 118/723 E; 118/723 I
[58] Field of Search .................................... 156/627, 345, 156/643; 204/192.13, 192.33, 298.03, 298.32; 427/8–10; 118/692, 723 E, 723 ER, 723 I, 723 IR, 723 MW, 723 ME, 723 MR, 723 MA, 723 AN

[56] References Cited

U.S. PATENT DOCUMENTS

| | | | |
|---|---|---|---|
| 4,166,783 | 9/1979 | TGurner | 204/298.03 X |
| 4,207,137 | 6/1980 | Tretola | 156/627 |
| 4,340,456 | 7/1982 | Robinson et al. | 204/298.32 X |
| 4,602,981 | 7/1986 | Chen et al. | 156/627 |
| 4,622,094 | 11/1986 | Otsubo | 156/627 |
| 4,665,315 | 5/1987 | Bacchetti et al. | 250/492.1 |
| 4,859,277 | 8/1989 | Barna et al. | 156/345 X |
| 4,949,670 | 8/1990 | Krogh | 156/627 X |
| 4,954,212 | 9/1990 | Gabriel et al. | 156/627 |
| 5,068,002 | 11/1991 | Monroe | 156/427 X |
| 5,102,687 | 4/1992 | Pelletier et al. | 156/627 X |
| 5,106,663 | 5/1992 | Mase et al. | 156/626X |
| 5,108,569 | 4/1992 | Gilboa et al. | 204/298.03 X |

FOREIGN PATENT DOCUMENTS

WO92/01308 1/1992 WIPO .................................. 156/627

OTHER PUBLICATIONS

H. F. Dylla, "Glow discharge techniques for conditioning high-vacuum systems", *J. Vac. Sci. Technol. A*, vol. 6, No. 3, May/Jun. 198, pp. 1276–1287.

W. R. McKinney et al., "Plasma Discharge Cleaning of Replica Gratings Contaminated by Synchrontron Radiation", *Nuclear Instruments and Methods*, 195, (1982), pp. 371–374.

R. L. Shannon et al., "Active Cleaning Technique Device", Design Study Summary Report D180–15454–1, Mar. 1973, pp. i–60.

T. Lohner et al., "Short Communication—The Role of Surface Cleaning in the Ellipsometric Studies of Ion–Implanted Silicon", *Radiation Effects*, 1981, vol. 54, pp. 251–252.

M. P. Splichal et al., "Application of chemometrics to optical emission spectroscopy for plasma monitoring", Department of Chemical and Nuclear Engineering, Univ. of N. Mexico.

The Bendix Corp. paper, "End–of Process Detection for Plasma Cleaning", Microelectronics Measurement and Test Conference, Mar. 23–24, 1982, San Jose, Calif.

*Primary Examiner*—Thi Dang
*Attorney, Agent, or Firm*—Peter T. Rutkowski; Richard L. Donaldson; William E. Hiller

[57] ABSTRACT

A plasma processing system 10 for fabricating a semiconductor wafer 24 is disclosed. The system includes a plasma processing tool 12 and an RF energy source 20 coupled to the plasma processing tool 12. An optional matching network 22 may be included between the RF energy source 20 and the plasma processing tool 12. Circuitry 18 for monitoring the RF energy to obtain a measurement characteristic is also provided. At least one transducer 14 or 16 is coupled between the plasma processing tool 12 and the circuitry 18 for monitoring the RF energy. The RF energy is typically applied at a fundamental frequency and the electrical characteristic is monitored at a second frequency different than the fundamental frequency. Also included is circuitry 19, such as a computer, for interpreting the measurement to determine a condition of the processing system 10. Other systems and methods are also disclosed.

34 Claims, 5 Drawing Sheets

METHOD AND SYSTEM FOR IDENTIFYING PROCESS CONDITIONS

This invention was made with government support under contract No. F33615-88-C-5448 awarded by United States Air Force. The Government may have certain rights in this invention. This application is a continuation, of application Ser. No. 07/868,357, filed on Apr. 14, 1992, entitled Method and System for Identifying Process Conditions.

FIELD OF THE INVENTION

This invention relates to a method and system for identifying process and machine conditions especially in plasma processors.

BACKGROUND OF THE INVENTION

Integrated circuit fabrication processes that use reactive plasmas are commonplace in today's semiconductor production lines. The term reactive plasma is meant to describe a discharge in which ionization and fragmentation of gases take place and produce chemically active species, frequently oxidizing and/or reducing agents. Such plasmas are reactive both in the gas phase and with solid surfaces exposed to them. When reactive plasmas were first used in semiconductor factories, in the early 1970's, little was known about the chemistry and physics of these discharges. Today, there is a broad base of empirical knowledge, some qualitative understanding of active mechanisms, and even some detailed understanding of specific isolated phenomena. This insight now allows for the tailoring of plasma processes to meet the more stringent requirements of today's submicron device features.

When using plasma processing, many problems can occur which will limit yields or reduce manufacturing throughput. For example, water vapor which enters the plasma processing chamber can detrimentally affect the production of the semiconductor wafers. This problem must be detected quickly or there is a great risk of poor yields.

Another problem with processing is the build up of contaminants on the chamber walls. Presently, typical processing factories require the chamber walls to be periodically cleaned after given time periods, for example, after a certain number of wafers have been processed. This technique presents some major drawbacks if the rate of buildup is not known, which it is usually not. For example, if the chamber walls are not cleaned often enough, there is a risk that some of the wafers which have been processed in the later stages will be contaminated and will suffer from poor yields. On the other hand, if the chamber is cleaned too often, then this represents a reduction in throughput will result. Therefore, there is currently a need for an in-situ real time detector of chamber wall cleanliness.

Accordingly, improvements which overcome any or all of the problems are presently desirable.

SUMMARY OF THE INVENTION

Other objects and advantages will be obvious, and will in part appear hereinafter and will be accomplished by the present invention which provides a method and system for identifying process/machine conditions.

In one aspect, the present invention provides a method to identify optimal chamber conditions which can be implemented in a process control scheme to prevent variation in chamber conditions resulting in increased and consistent wafer yields. Currently, no technique exists for comprehensively identifying in-situ the machine's state, for example, the chamber wall and electrode conditions. This shortcoming leads to many problems. The lack of an in-situ sensor measurement requires the use of pilot or test wafers to determine if the chamber conditions are correct for processing material. This additional work reduces throughput and increases operating expense. Lack of an in-situ sensor also precludes the use of control systems to maintain optimal chamber conditions. SQC (statistical quality control) capabilities are also reduced without a direct measure of machine states since pilots are influenced by previous processing and do not completely indicate a machine problem. Further, the inability to identify chamber conditions can result in improper chamber cleaning. Over cleaning will reduce throughput, while incomplete cleaning will result in reduced wafer yields due to particles and altered process conditions. In addition, inadvertent and unnoticed alterations to chamber conditions, such as exposure to water vapor, may cause product to be scrapped.

A plasma processing system for fabricating semiconductor wafers which overcomes many of the problems is disclosed herein. In a preferred embodiment, the system includes a plasma processing tool and an RF energy source coupled to the plasma processing tool for applying RF energy to the plasma processing tool. An optional matching network may be included between the RF energy source and the plasma processing tool. Circuitry for monitoring the RF energy to obtain a measurement characteristic is also provided. At least one transducer is coupled between the plasma processing tool and the circuitry for monitoring the RF energy. The RF energy is typically applied at a fundamental frequency and the electrical characteristic is monitored at an associated frequency different than the fundamental frequency as well as the fundamental frequency. Also included is circuitry for interpreting the measurement, such as a computer, to determine a condition of the processing system.

A method of determining and possibly controlling a condition in a processing system is also disclosed herein. A processing system including an electromagnetic power source and a processing chamber is provided. Electromagnetic energy, e.g., RF power, is applied to the processing system and at least one electrical characteristic of the electromagnetic energy is monitored to obtain a measurement characteristic. The electrical characteristic may be one or all of power, phase, RMS voltage, RMS current, peak-to-peak voltage, peak-to-peak current, and impedance and may be measured in time. Typically, the power is applied at a fundamental frequency and the electrical characteristic is monitored at an associated frequency. The measurement characteristic is then measured to determine the condition of the processing system.

An advantage of the invention is that this method is not influenced by noncritical variables such as dirty optics. In addition, this application of the sensor serves as a direct measure of the chamber conditions as well as process conditions. Further, the present invention provides an in-situ and real time method. Therefore, the present invention may be used with real time control of the processing steps. The method and system described herein can also serve as a final assembly checkout tool.

BRIEF DESCRIPTION OF THE DRAWINGS

The above features of the present invention will be more clearly understood from consideration of the following descriptions in connection with accompanying drawings in which:

FIG. 5b is a graph of experimental results of the cosine phase at 13.56 MHz for the same wafers as in FIG. 5a.

Corresponding numerals and symbols in the different figures refer to corresponding parts unless otherwise indicated.

DETAILED DESCRIPTION OF PREFERRED EMBODIMENTS

Figure 1:
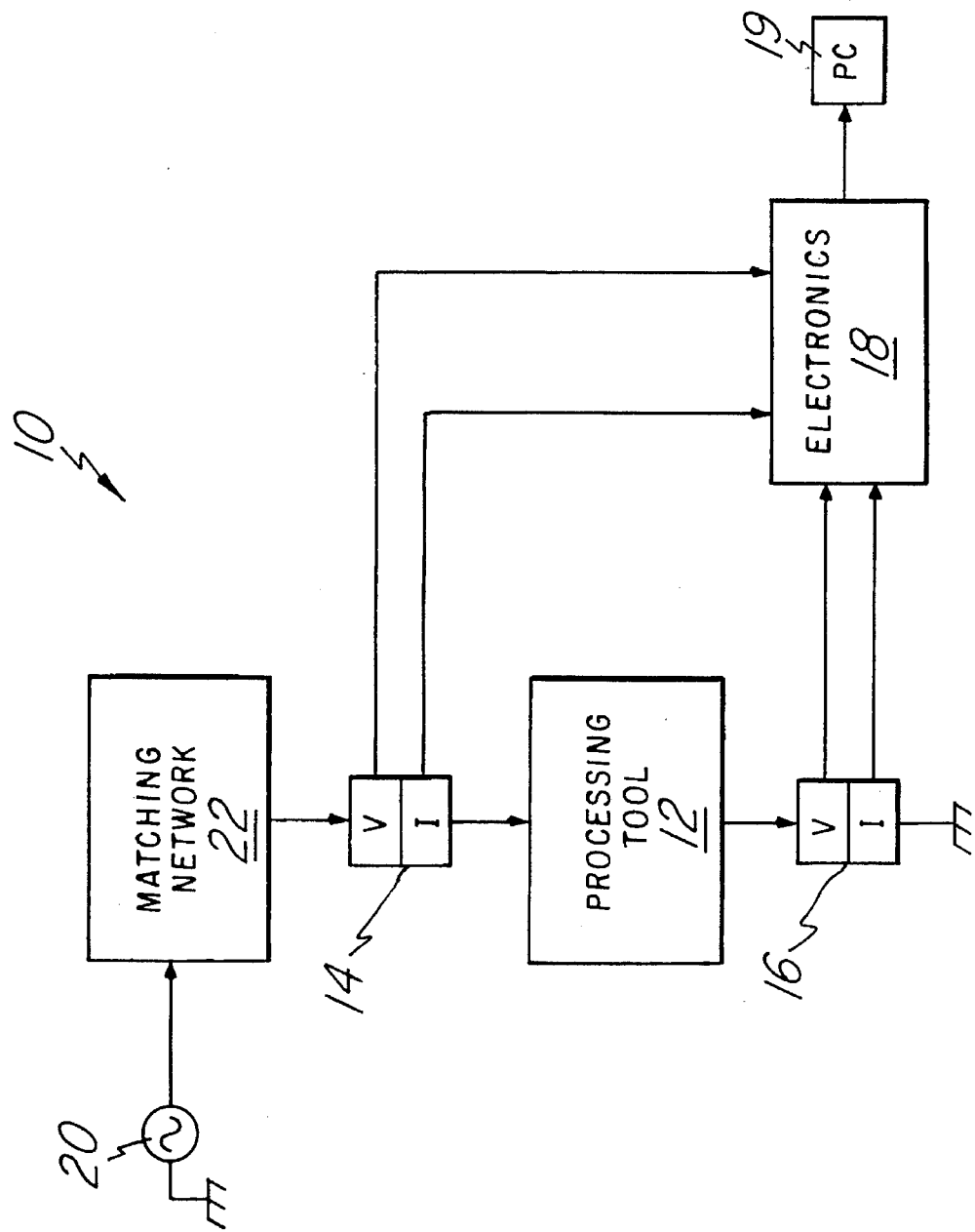
FIG. 1 is a simplified block diagram of a processing system of the present invention.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the system and method of the present invention. A brief description of the problem solved by the present invention will be described. The preferred embodiment will then be described followed by a description of modifications. A summary of some experimental results will then be described.

The present invention proposes a method and system to observe the plasma state with the current and voltage characteristics in order to identify and/or estimate the machine's state. In this patent, the machine's state includes items such as wall material or buildup upon the walls, absorbed gases on walls, electrode material and buildup, electrode spacing, type of power supply as well as others. Processing conditions include items such as power delivered, composition of plasma, pressure, and transient (temporal) responses in conditions. The estimation of these conditions can be used to identify the optimal machine state. As a result, chamber conditions can be altered, for example, by cleaning or conditioning, to achieve the optimal machine state. It is proposed to use the machine state identification in an automated feedback control loop so that chamber alteration is done in an efficient manner. Finally, the sensor output can be used in an SQC (statistical quality control) environment or to determine when chamber conditions have changed.

In one example, investigation of the solution revealed that the chamber condition changes may be seen in the harmonics, while no such changes are seen in the fundamental electrical signal. For example, pressure problems, routine maintenance and chamber exposure to the atmosphere effect the phase of the harmonic signals and can be detected. On the other hand, the phase of the fundamental signal may not be effected by these same activities.

As is known, plasma cleaning of electromechanical components, optical surfaces, and aerospace components has wide spread use because it is particularly effective for removing the last traces of organic contamination. In addition, the effect of surface contamination on the measured ellipsometric parameters has been investigated showing that ellipsometric measurements are a function of the time of plasma cleaning. These investigations, however, do not deal with RF electrical signals (at the fundamental or other frequencies).

Optical emission spectroscopy can be used to monitor signals from emitting species in the plasma. Chemometrics has been applied to the optical emission spectrum taken from plasma processes to arrive at a comprehensive empirical mapping of plasma processing state to optical signals. It has been reported that variations in the optical emission intensity show a near unity correlation with probe measurements at the fundamental frequency if a broad spectrum of the emission is examined using multivariate statistical algorithms (chemometrics) and the spacial dependence of the emission is considered. The problem with this approach is that the plasma state must emit light. These emitting species are not as directly effected by machine construction effects as are RF electrical signals. This is because the condition of the chamber walls effects the plasma's ability to work on the wafer but the optical signals only are sensitive to emission from species in the bulk of the plasma. These wall effects confound the correlation of optical signals to chamber state. In addition, optical signals are influenced by dirty optics, which do not effect the process.

In addition, the number of wafers processed before a plasma cleaning process is required can be determined by monitoring particle levels associated with the process. Once the particle count rises to a level where yield is unacceptable, a dry clean can be performed. The number of wafers run between dry cleans is then fixed to keep the particle levels below a certain threshold. However, improper cleaning procedures are typically noticed only because product yield is low. Unfortunately, product yield is not well correlated to process associated particle levels. Thus, when low yields occur, corrective actions such as a dry clean, can then be taken until yield rises to an acceptable level.

After a plasma cleaning process, e.g., dry clean, a larger optical emissions intensity is seen until a few wafers are processed. These first few wafers season the chamber back to an optimal operating state.

The dry clean effects the overall chamber so the increased intensity is a result of a chamber condition that allows the RF power to couple better causing a brighter plasma and not from cleaner optics. This confounds the use of optical emission to indicate if the chamber state is acceptable for processing product.

Further, wet clean may typically be performed when the optical signal degrades to the point where it is not useful for endpointing. Usually, the wet clean is required to restore the optical signal for endpointing before the particle count is high enough to reduce yields.

In addition, the DC bias signal could be used to indicate a machine state acceptable for processing product. A plasma cleaning process could be run until the DC bias is at a level that is mapped to an acceptable machine state. It has been found that DC bias signal behavior is the same for different machine states with the same process settings. Therefore, a correlation to an acceptable machine state is confounded. In addition, it is more desirable to induce and control DC bias. If DC bias is part of a control loop, then it could not be used as a monitor.

Referring now to FIG. 1 a general block diagram of a system 10 of the present invention is illustrated. The system includes a processing tool 12 which has voltage and current transducers 14 and 16 coupled thereto to perform measurements of electromagnetic characteristics. The outputs of transducers 14 and 16 are coupled to electronics 18 which comprises circuitry for determining the electrical characteristics of the electromagnetic signal. It is noted that either transducer 14 or transducer 16 or both may be used. The electromagnetic power is provided by power supply 20 which may comprise a RF power supply, for example at 13.56 MHz. Power may then be coupled to matching network 22. Matching network 22 is optional and can be used if there is an impedance mismatch between the power supply 20 and the processing tool 12. The matching network 22 is not required for the present invention.

In general, the system 10 may be utilized for all processes involving the application of an electromagnetic power source to an electrode, such as plasma etching or deposition system. The system may also be used to monitor and control plasma cleaning machinery.

The processing tool 12 may comprise a capacitively coupled plasma etched tool, for example, a parallel plate system. In this system, the semiconductor wafer being processed may be grounded or may be applied or may have the RF signal applied to it. The system may be the reactive ion etching system for example.

The present invention also applies to high density plasma systems. Examples of these systems are inductively coupled or transformer coupled processing systems that may or may not use helicon or helical wave generators and magnetron systems such as an ECR (electron-cyclotron resonance) system.

The systems may optionally comprise high density plasma systems. An example of a high density plasma system would be a magnetton system.

The transducers 14 and 16 are included to provide voltage and current information to the electronics. The voltage probe is a capacitively coupled voltage transducer. The current probe is a transformer coupled current transducer. Both the current and the voltage probes are housed together. The housing assembly is placed in-line and constructed so to maintain the coaxial nature of the power transmission.

The transducers 14 and 16 are coupled to electronic circuitry 18. The electronics circuitry 18 are operable to obtain a measurement characteristic signal from the electrical measurements. The electronic circuitry 18 will feed to a circuit 19 for interpreting the measurement signature to determine the condition of the processing system. In one example, the circuitry 19 for interpreting the measurement system may be a personal computer (or other computer terminal, workstation or mainframe) or other signal recording hardware. The electronics circuitry 18 may typically comprise electrical components such as filters, multipliers, transducers, digitizers, and other circuitry. The output of the electronic circuitry 18 may be either in digital, analog, or a combination of both. Measurement information such as impedance, power, phase, RMS voltage, RMS current, peak-to-peak voltage and peak-to-peak current can be measured over time to determine the characteristics of the signal, such as wave shape for example. This information is typically measured at the fundamental or driving frequency (e.g., the power supply frequency) and other frequencies such as the harmonic or subharmonic frequencies. An example of an exemplary measurement circuit 18 is illustrated in FIG. 2.

Figure 2:
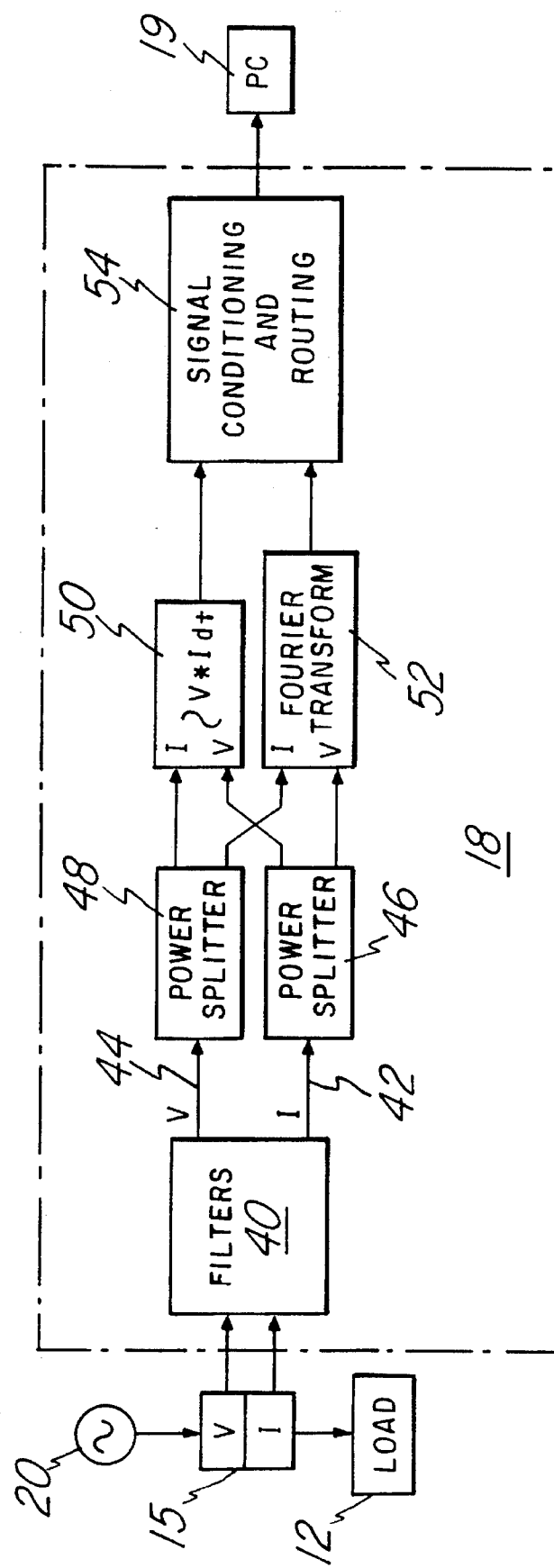
FIG. 2 is a block diagram of an exemplary circuit for monitoring electromagnetic energy signals.

Referring now to FIG. 2, a transducer 15 (which may represent one or both of transducers 14 and 16) is coupled to the input of the measurement circuit 18. The voltage and current inputs are coupled to a filter 40. Typically the filter 40 may be a notch filter for each of the current and voltage signal. The filter is typically centered at the fundamental frequency (e.g., 13.56 MHz). The filtered current output 42 is coupled to a first power splitter 46 while the filtered voltage output 44 is coupled to a second power splitter 48. One output of each of the power splitters 46 and 48 are coupled to a integration circuit 50 and a Fourier transform (e.g., fast fourier transform) circuit 52. The integration circuit 50 and the Fourier transform circuit 52 may be formed on separate printed wiring boards. The outputs of the integration circuit 50 and the Fourier transform circuit 52 are coupled to signal conditioning and routing circuit 54. The signal conditioning and routing circuit 54 prepares the signals representing the items from the measurement set. Examples of these items include RMS voltage, RMS current, power, peak-to-peak voltage, and peak-to-peak current. These quantities may be given at various frequencies.

The circuit 18 operates as follows. The notch filters 40 and power splitters 46 and 48 are used to precondition the signals. The preconditioned signals are then sent to the integration circuit 50 and the Fourier transform circuit 52. The integration circuit 50 integrates the product of the voltage and current signals thus obtaining a measure of the power passed through the transducer 15. The Fourier transform circuit 52 performs a Fourier transform on the voltage and current signals to obtain a measure of the frequency spectrum present in the signals. The signal conditioning and routing circuit 54 will scale and allow selection of signals to be used as inputs for the applications disclosed herein. Selection may be done since not all possible signals will be required for each application.

The output of the measurement circuit 18 is coupled to the circuitry 19 for interpreting the measurement system which, as previously mentioned, may be a computer or other signal recording hardware. The computer 19 can use the signals as inputs for control algorithms, diagnostic determinations and process monitoring.

The measurement information may be interpreted separately or combined for interpretation. In other words, the measurement information may be used in univariate or multivariate analysis. For example, the signals may be combined and correlated in using a $T^2$ methodology.

In analyzing the frequency spectrum, the fundamental frequency, the harmonic frequencies (i.e. integer multiples of the fundamental frequency), subharmonic frequencies (i.e. frequencies lower than the fundamental frequency), and other frequencies (which may arise due to nonlinearities in the system) may be analyzed. These frequencies may be either transient or steady state.

In interpreting the measurement data, the characteristics of the entire system will be analyzed. For example, the system may include the power supply 20, the matching network 22, the processing chamber 12, and the wafer which is being fabricated (not shown in FIG. 1). It is the function of the electronics in the other circuitry to determine the significance of each of these measured quantities.

The method and system of the present invention may be used for many purposes. For example, the system may be used to check diagnostic measurements such as pressure problems, water vapor leakage into the chamber, power supply problems, or matching network problems. The system may also be used for regularly scheduled maintenance such as cleanup of the chamber. In addition, the system may be used to monitor and/or control processing conditions such as etch and/or deposition. For example, the method and system may be used to check for uniformity and endpoint measurements of a processing step. Of course, when making uniformity measurements the uniformity of the starting material must be considered.

The system may also be used to monitor the processing to establish the possibility of a problem. When a significant change is encountered, the process conditions have changed and therefore a problem may have arisen. At this point, processing may stop and diagnosis may begin.

Although described herein primarily with reference to semiconductor processing, the present invention may be used in a great number of plasma applications. Examples of non-semiconductor applications include processes which coat medical devices or mirrors. In particular, the present invention is extremely useful in plasma polymerization processes.

It is noted that different machines will typically have different measurement characteristics. That is, different electrical characteristics must be interpreted to determine different things. These measurement characteristics are typically determined empirically. It is anticipated that in the future, commonalities will be found to determine common trends in different processing equipment and therefore less empirical study will be necessary for each particular processing machine or machine type.

Figure 3:
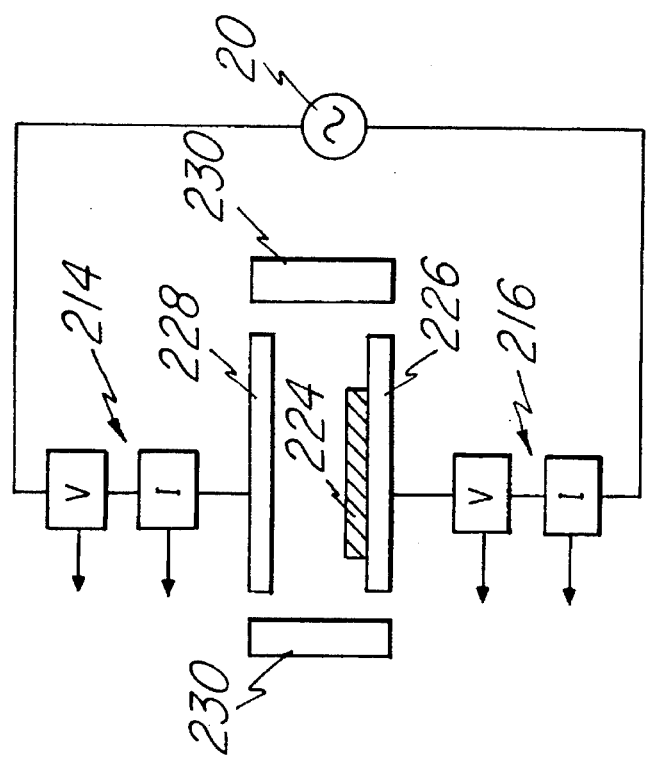
FIG. 3 provides an example of a capacitively coupled processing system.

Referring now to FIG. 3, a parallel plate capacitively coupled processing chamber is shown in more detail. As shown in the figure, a wafer 224 is mounted on a chuck 226. The chuck 226 may be electrically grounded or may have a signal applied to it. A second chuck 228 is spaced from the wafer 224 to provide the second electrode in the system. In a case not illustrated, the second electrode may be provided by the chamber walls and therefore the second chuck 228 would not be necessary. The second chuck 228 may also be either electrically grounded or have the signal applied thereto. (Obviously, both electrodes will not be grounded if a plasma is to be generated.)

As illustrated in FIG. 3, each electrode 226 and 228 may have a transducer 216 or 214 coupled to measure the electrical characteristics. As previously mentioned, it may be necessary to include only one of the transducers 214 or 216.

Also illustrated in FIG. 3 are magnets 230 which are optional and may be used to generate ECR (electron cyclotron resonant) modes.

Figure 4:
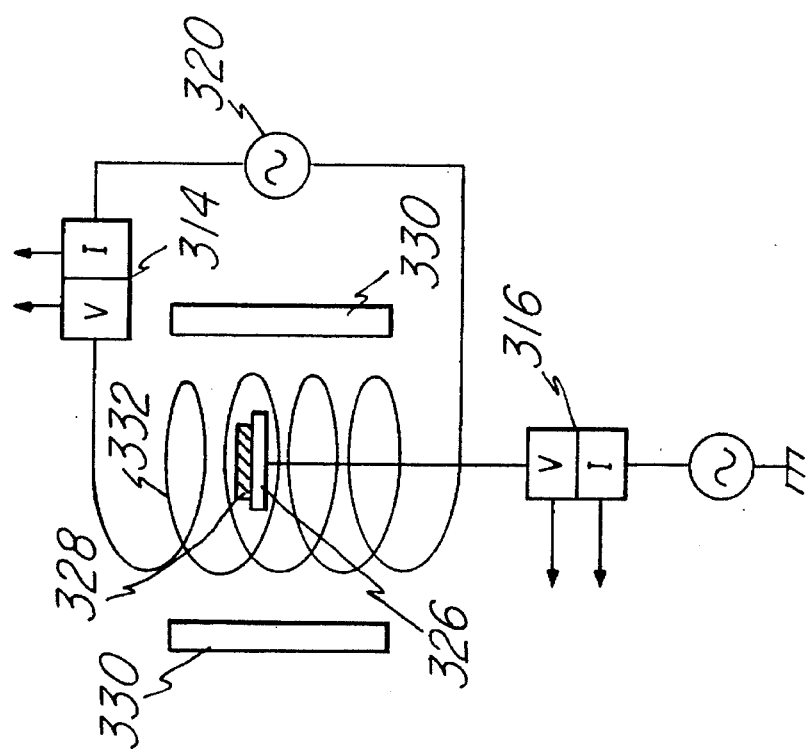
FIG. 4 provides an example of a inductively coupled processing system.

Referring next to FIG. 4, an inductively coupled processing chamber is shown in more detail. In this case, the wafer 328 is mounted on a chuck 326 which is coupled to transducer 316. An inductive coil 332 is provided to generate the plasma for processing. A transducer 314 is provided in series with the inductive coil 332 to measure RF electrical characteristics.

Although two specific examples have been illustrated, it should be recognized that the present invention applies to all processes involving the application of electromagnetic power source to an electrode. Other examples include antenna impedance monitoring and RF power supply quality inspections.

The method and system of the present invention has been experimentally tested in a standard advanced vacuum processor (AVP), i.e., a single wafer processing system, configured in the reactive ion etching (RIE) mode with a wide electrode gap. An optical emission endpoint scheme may be used. Current and voltage probes were used at the electrode connection of the power supply/matching network, and the output from these probes fed into a network analyzer, such as a HP4195A Automatic Network Analyzer. This analyzer allows a discrete table and will measure the amplitude and phase of the frequencies listed in this table.

A central composite design was run with the following variables in the following domain: pressure between about 100 and 200 mtorr, RF power between about 300 to 500 watts, $CHF_3$ between about 30 and 50 sccm, $CF_4$ between about 40 and 80 sccm, and $O_2$ between about 10 and 20 sccm. Argon was held constant at about 100 sccm and the helium chuck pressure was about 2.5 torr. The substrate chuck temperature was maintained at about 0° C.

In this case, experiments were run for nitride on polysilicon on oxide on silicon (blanket), nitride on oxide on silicon (blanket), and nitride on polysilicon on oxide on silicon (patterned). A cleanup wafer was run after approximately every two wafers.

In order to have a reference for the subsequent data analysis, the phase at a frequency is the phase measured for the voltage minus the phase measured for the current. The power ($W_i$) is defined as $$W_i = I_i * V_i * \cos\theta_i$$

where $I_i$ is the current at frequency i, $V_i$ is the voltage at frequency i, $W_i$ is the power at frequency i, and $\theta_i$ is the phase at frequency i. The impedance ($Z_i$) is defined as $$Z = \frac{V_i * \cos(\theta_i)}{I_i}$$

The quantities $I_i * V_i$ and $V_i/I_i$ may also be examined.

For this particular example, no calibration method was employed. The calibration for the magnitudes will be constant, and consequently are absorbed in the fitted coefficients of the models. However, the phase is typically more difficult to calibrate. The phase calibration adds to the measured phase. Because the equations for power and impedance involve cosine of the phase, the impact of uncalibrated phase data upon the power and impedance is not apparent.

Figure 5A:
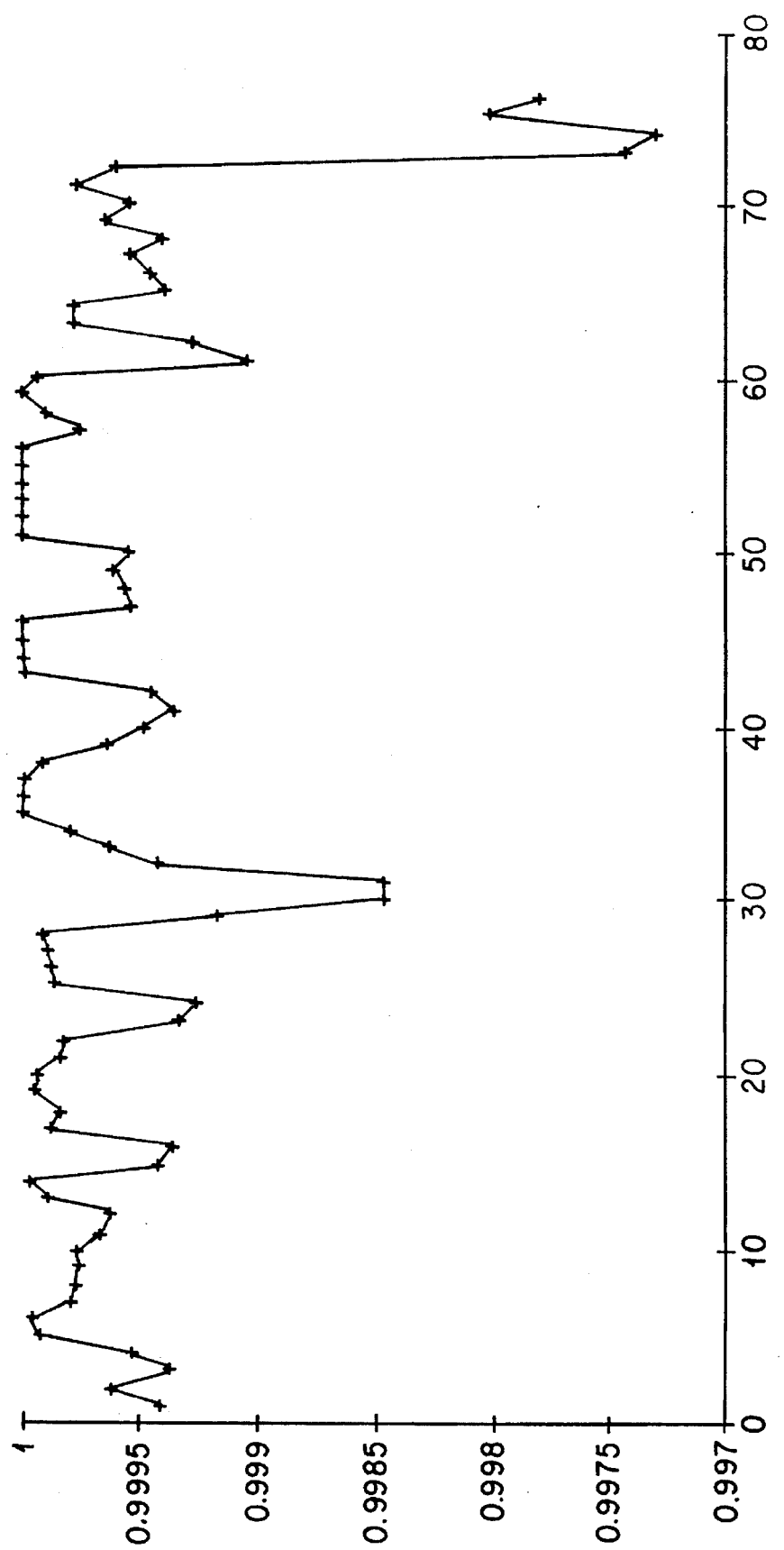
FIG. 5a is a graph of experimental results of the cosine phase at 27 MHz and 40 MHz as a function of run number for blanket wafers.
Figure 5B:
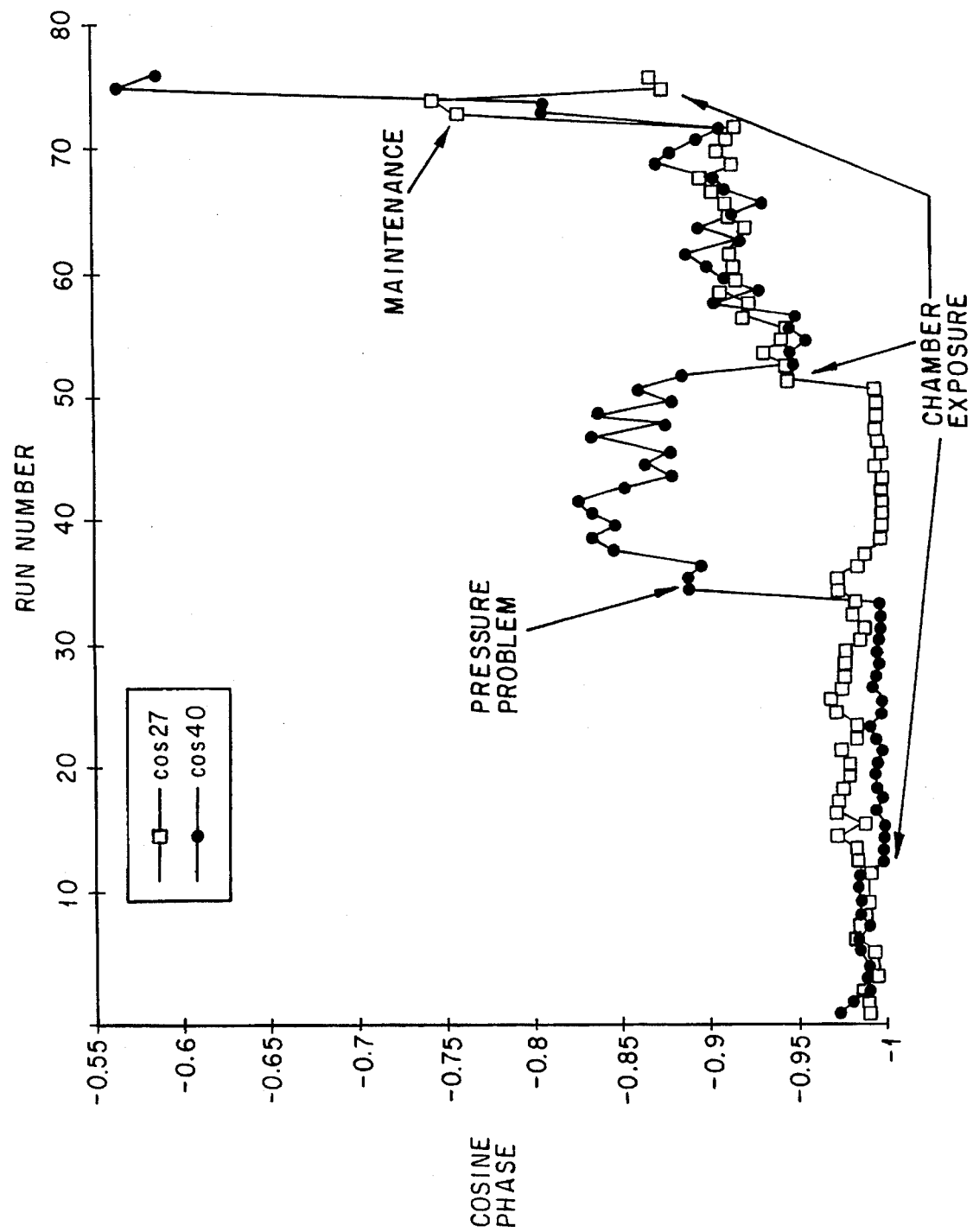

An example of the response as a function of run number is given in FIG. 5a with the fundamental frequency (13.56 MHz, in this case) and in FIG. 5b for the first two harmonics (27 and 40 MHz, in this case). It is noted that in FIG. 5a and 5b, each successive pair was run at the same condition, e.g., run numbers 5 and 6 were at the same experimental conditions. In FIG. 5a and 5b, the response shift after a chamber exposure was not the same for all exposures. This difference is due to both the time of pump down (e.g., overnight versus one hour) as well as a confounding with the pressure problem.

Based on the responses of all the signals, the suggestion for which signals to monitor for a given problem can be made. For example, the pressure problem was noted by measuring one or more of the following: 1) impedance (or $V_i/I_i$ at 27 MHz and/or 40 MHz (i.e., the first two harmonics); 2) phase at 40 MHz, and 3) phase at 27 and/or 54 MHz (to a lesser degree). The chamber exposure to air was noted by measuring either the phase at 27 and/or 40 MHz and possibly the impedance (or $V_i/I_i$) 40 MHz.

It is noted that while this data is for blanket wafers only, the conclusions are appropriate for patterned wafers where the only event was a chamber exposure to atmosphere near the end of the experiment. The signals at 40 MHz appear to be more sensitive (i.e., exhibited a larger shift) than the signals at 27 MHz. Because of the noise level caused by the narrow bandwidth of the network analyzer, it was difficult to make conclusions about the higher harmonics. However, previous work with an analog spectrum analyzer suggests that 54 MHz may be very sensitive to changes. In addition, this previous work also found "half harmonics" that were indicative of the process stabilization. These signals were not investigated in this particular study but may also be important for diagnosis.

The signals at 13.56 MHz (i.e., the fundamental frequency or the power supply frequency) did not appear to provide diagnostic information. It is not fully understood why the information could be derived from the high-harmonics (or subharmonics) but not from the fundamental frequency.

Another function of the method and system of the present invention is to determine the functional form of the relationship of delivered power to the power supply set point and other processing conditions. It has been found that small changes in flow and composition do not cause significant changes in the delivered power as compared to natural variations caused by replication error. However, large composition or flow changes, which may impact the signals, were not induced in this experiment. It has been shown that the gain, defined as the change in response of the delivered power with the set point changes, is a function of pressure. Thus, pressure affects both the magnitude of delivered power and the gain for a given power set point.

The present invention may also be used to model etch rate using RF signals. In order to determine if the signals were indications of etch rate, an attempt was made to model the etch rate as a function of the RF signals. Stepwise regression was used to select the significant variables to include in the model and several "goodness-of-fit" tests were performed. Using the data from the fundamental (13.56 MHz) alone, an adjusted $R^2$ of 0.80 with a standard error of estimate of 9% was obtained for the fit of etch rate. Based on replicates, the theoretical limit for the standard error of the estimated 6%. Adding in harmonic measurements to the model only slightly increased the goodness of fit.

In conclusion, for one particular set of experiments RF signals were collected on experiments using a nitride etcher. The results of this work can be used to evaluate the usefulness of monitoring, and possibly controlling, the RF signals. RF power delivered to the electrode was found to be a function of power and pressure. Consequently, if either the power supply or pressure controller experience problems, it will be difficult to diagnose the source of the problem. In addition, the effects of pressure and power are confounded when doing RSM (Response Surface Methodology) using the power supply set point. Because the etch rate was found to be a function of current and voltage, rather than power, implementation of the control system to maintain voltage and current as specified values appears warranted.

It was also found that the phase and impedance did not respond to changes in processing conditions encountered in this experiment, only to changes in machine conditions. Based upon the analysis, it would seem that the chamber wall/electrode are the dominant factors in determining the measured phase and impedance. This observation would suggest that the phase and/or impedance would be an indicator of altered chamber conditions, such as polymeric depositions or adsorbed water vapor. If so, a control loop could be implemented for pump down time or time of cleanup steps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of determining the condition of a processing system comprising the steps of:

providing a processing system including an electromagnetic power source and a processing chamber;

applying electromagnetic energy at a fundamental frequency to said processing system;

monitoring at least one electrical characteristic of said electromagnetic energy to obtain a measurement characteristic wherein said electromagnetic energy is applied at said fundamental frequency and said electrical characteristic is monitored at at least one associated frequency different than said fundamental frequency; and interpreting said measurement characteristic to determine the condition of said processing system.

2. The method of claim 1 wherein said measurement characteristic indicates information about impurities in said processing chamber.

3. The method of claim 1 wherein said measurement characteristic indicates information about a pressure or control thereof in said processing chamber.

4. The method of claim 1 and further comprising the steps of:

providing a wafer in said processing chamber, said wafer including a first material formed thereon; and etching said first material wherein said measurement characteristic indicates information about the etch rate or uniformity of said first material.

5. The method of claim 1 and further comprising the steps off providing a wafer in said processing chamber; and depositing a first material on a surface of said wafer wherein said measurement characteristic indicates information about the deposition rate or uniformity of said first material.

6. The method of claim 5 said information comprises endpoint information.

7. The method of claim 1 and further comprising the step of cleaning said processing chamber wherein said cleaning is controlled at least in part based upon said measurement characteristic.

8. The method of claim 7 wherein said cleaning step comprises leaving said process chamber under substantially vacuum conditions.

9. The method of claim 1 wherein said processing chamber comprises a plasma processing chamber.

10. The method of claim 1 wherein said electrical characteristic is chosen from the group consisting of power, phase, RMS voltage, RMS current, peak-to-peak voltage, peak-to-peak current, and impedance.

11. The method of claim 1 and further comprising the step of monitoring said at least one electrical characteristic at said fundamental frequency.

12. The method of claim 1 wherein said measurement characteristic is obtained by monitoring combinations of signals.

13. The method of claim 12 wherein said combinations of signals are measured at a single frequency.

14. A method of controlling a machine condition of a processing system, comprising the steps off providing a processing system including an electromagnetic power source and a processing chamber;

applying electromagnetic energy at a fundamental frequency to said processing system;

monitoring at least one electrical characteristic of said electromagnetic energy at an associated frequency different than said fundamental frequency to obtain a measurement characteristic, said measurement characteristic providing information about a machine condition;

interpreting said measurement characteristic to determine said information about said machine condition; and affecting said machine condition, wherein said affecting step is controlled at least in part based upon said information.

15. The method of claim 14 wherein said machine condition comprises contamination on a wall of said processing chamber and said affecting step comprises cleaning said wall.

16. The method of claim 15 wherein said step of cleaning said wall comprises maintaining said process chamber at a low pressure.

17. The method of claim 14 wherein said machine condition comprises a pressure within said processing chamber and said affecting step comprises changing said pressure.

18. The method of claim 17 wherein said changing step comprises lowering said pressure.

19. A method of fabricating a device comprising the steps of:

providing a processing system including an electromagnetic power source and a processing chamber;

providing a device to be fabricated within said processing chamber;

applying electromagnetic energy at a fundamental frequency to said processing system;

performing a process step on said device;

monitoring at least one electrical characteristic of said electromagnetic energy at said fundamental frequency and at an associated frequency different than said fundamental frequency to obtain a measurement characteristic, said measurement characteristic providing information about said device to be fabricated;

interpreting said measurement characteristic to determine said information about said device; and controlling said process step wherein said controlling step is at least in part based upon said information.

20. The method of claim 19 wherein said step of performing a process step comprises depositing a material upon said device.

21. The method of claim 20 wherein said information comprises deposition uniformity information.

22. The method of claim 20 wherein said information comprises deposition rate and endpoint information.

23. The method of claim 19 wherein said step of performing a process step comprises etching a material from said device.

24. The method of claim 20 wherein said information comprises etch uniformity information.

25. A processing system comprising:

a processing tool;

an electromagnetic energy source coupled to said processing tool for applying electromagnetic energy at a fundamental frequency to said processing tool;

circuitry for monitoring said electromagnetic energy at an associated frequency different than said fundamental frequency to obtain a measurement characteristic;

a transducer coupled between said processing tool and said circuitry for monitoring said electromagnetic energy; and circuitry for interpreting said measurement characteristic to determine a condition of said processing system.

26. The system of claim 25 wherein said processing tool comprises a capacitively coupled plasma processing chamber.

27. The system of claim 25 wherein said processing tool comprises an inductively coupled plasma processing chamber.

28. The system of claim 25 and further comprising a matching network coupled between said electromagnetic energy source and said processing tool.

29. The system of claim 25 wherein said measurement characteristic is chosen from the group consisting of power, phase, RMS voltage, RMS current, peak-to-peak voltage, peak-to-peak current, and impedance.

30. The system of claim 25 wherein said associated frequency is a rational multiple of said fundamental frequency.

31. The system of claim 30 wherein said associated frequency is less than said fundamental frequency 32. The system of claim 25 wherein said transducer is coupled between said processing tool and a reference potential.

33. The system of claim 25 wherein said transducer is coupled between said processing tool and said electromagnetic energy source.

34. The system of claim 33 and further comprising a second transducer coupled between said processing tool and a reference potential.

* * * * *